US012787362B2

(12) United States Patent
Li et al.

(10) Patent No.: US 12,787,362 B2
(45) Date of Patent: Nov. 3, 2026

(54) SEMICONDUCTOR DEVICE AND METHOD FOR MANUFACTURING THE SAME

(71) Applicant: INSTITUTE OF MICROELECTRONICS, CHINESE ACADEMY OF SCIENCES, Beijing (CN)

(72) Inventors: Junjie Li, Beijing (CN); Enxu Liu, Beijing (CN); Na Zhou, Beijing (CN); Jianfeng Gao, Beijing (CN); Junfeng Li, Beijing (CN); Yongliang Li, Beijing (CN); Jun Luo, Beijing (CN); Wenwu Wang, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 221 days.

(21) Appl. No.: 18/725,967

(22) PCT Filed: Nov. 27, 2023

(86) PCT No.: PCT/CN2023/134324
§ 371 (c)(1),
(2) Date: Jul. 1, 2024

(87) PCT Pub. No.: WO2024/114575
PCT Pub. Date: Jun. 6, 2024

(65) Prior Publication Data

US 2025/0081530 A1 Mar. 6, 2025

(30) Foreign Application Priority Data

Nov. 30, 2022 (CN) ........................ 202211533953.5

(51) Int. Cl.
*H10D 30/67* (2025.01)
*H10D 30/01* (2025.01)
(Continued)

(52) U.S. Cl.
CPC ....... *H10D 30/6735* (2025.01); *H10D 30/014* (2025.01); *H10D 30/43* (2025.01);
(Continued)

(58) Field of Classification Search
CPC ...... H10D 30/021; H10D 30/60; H10D 62/10; H10D 62/17; H10D 84/0147; H10D 84/0151
See application file for complete search history.

(56) References Cited

U.S. PATENT DOCUMENTS 9,461,114 B2 10/2016 Obradovic et al.
2016/0351591 A1 12/2016 Xie et al.
(Continued)

FOREIGN PATENT DOCUMENTS

CN 103400858 A 11/2013
CN 106298921 A 1/2017
(Continued)

OTHER PUBLICATIONS

International Search Report (Feb. 7, 2024) and Written Opinion (Feb. 7, 2024) for PCT/CN2023/134324, 9 pages.

*Primary Examiner* — Fazli Erdem
(74) *Attorney, Agent, or Firm* — Goodwin Procter LLP

(57) ABSTRACT

A semiconductor device and a method for manufacturing the same. The method comprises: providing a substrate; forming a fin, a dummy gate, a first spacer, and a hard mask on a surface of the substrate; etching the substrate to form a groove located directly beneath the fin and running through a second spacer; forming, in the groove, a filling layer made of an insulating dielectric material, and thermal conductivity
(Continued)

of the insulating dielectric material is higher than that of the substrate; removing the second spacer through etching; removing two opposite ends of each sacrificial layer to form cavities; filling the cavities to form inner spacers; forming a source and a drain on the substrate; forming a first dielectric layer; planarizing the first dielectric layer to expose the dummy gate; removing the dummy gate to release a channel comprising conductive nanosheets; forming a surrounding gate surrounding the conductive nanosheets.

10 Claims, 16 Drawing Sheets

(51) Int. Cl.

| | |
|---|---|
| ***H10D 30/43*** | (2025.01) |
| ***H10D 62/10*** | (2025.01) |
| ***H10D 62/13*** | (2025.01) |
| ***H10D 64/01*** | (2025.01) |
| ***H10D 84/01*** | (2026.01) |
| ***H10D 84/03*** | (2025.01) |
| ***H10D 84/85*** | (2025.01) |
| ***H10P 50/24*** | (2026.01) |
| ***H10W 10/00*** | (2026.01) |
| ***H10W 10/17*** | (2026.01) |

(52) U.S. Cl.

CPC ....... *H10D 30/6757* (2025.01); *H10D 62/115* (2025.01); *H10D 62/121* (2025.01); *H10D 62/151* (2025.01); *H10D 64/017* (2025.01); *H10D 84/017* (2025.01); *H10D 84/038* (2025.01); *H10D 84/85* (2025.01); *H10P 50/242* (2026.01); *H10W 10/014* (2026.01); *H10W 10/17* (2026.01)

(56) References Cited

U.S. PATENT DOCUMENTS

| | | | | |
|---|---|---|---|---|
| 2019/0074224 | A1* | 3/2019 | Xie ...................... | H10D 30/014 |
| 2023/0066323 | A1* | 3/2023 | Huang ................. | H10D 30/014 |

FOREIGN PATENT DOCUMENTS

| | | | |
|---|---|---|---|
| CN | 110767607 | A | 2/2020 |
| CN | 114927555 | A | 8/2022 |
| CN | 115831876 | A | 3/2023 |

* cited by examiner

SEMICONDUCTOR DEVICE AND METHOD FOR MANUFACTURING THE SAME

This application is the national phase of International Application No. PCT/CN2023/134324, titled "SEMICONDUCTOR DEVICE AND METHOD FOR MANUFACTURING THE SAME", filed on Nov. 27, 2023, which claims the priority to Chinese Patent Application No. 20221153953.5 titled "SEMICONDUCTOR DEVICE AND METHOD FOR MANUFACTURING THE SAME", filed with the China National Intellectual Property Administration on Nov. 30, 2022, the entire content of which is incorporated herein by reference.

FIELD

The present disclosure relates to the technical field of semiconductors, and more particularly to a semiconductor device and a method for manufacturing the semiconductor device.

BACKGROUND

As miniaturization follows the Moore's law, complementary metal oxide semiconductor (CMOS) devices in mass production have entered a technology node ranging from 5 nm to 3 nm. The CMOS devices having a gate-all-around (GAA) structure are capable to suppress the short-channel effect effectively.

A substrate of the CMOS device would provide a parasitic channel, which deteriorates performances of the entire CMOS device such as introduces a leakage current. Reference is made to FIG. 1. In FIG. 1, dotted lines running through a nano-level stacking structure 4 along a horizontal direction represent a standard channel 01, that is, a GAA channel. Another dotted line running through the substrate 1 along the horizontal direction represents a parasitic channel 02, that is, a non-GAA channel. Performances of the non-GAA channel are worse than those of the GAA channel under gate control, and leakage current is likely to exist in the non-GAA channel. Hence, quality of the CMOS devices is affected.

In order to suppress the parasitic channel 02, it has been proposed that $SiO_2$ isolation is utilized to achieve eliminate the parasitic channel thoroughly. Reference is made to FIG. 2. An isolation layer 03 made of $SiO_2$ may be deposited on an upper surface of the substrate 1, and a fin, a source electrode 2, a drain electrode 3, and a gate are disposed on the isolation layer 03. Thermal conductivity of $SiO_2$ is as low as merely 7.9 W/mK, which is much lower than that of Si, i.e., 150 W/mK, and hence efficiency of heat dissipation in the CMOS devices is lowered. In a case that heat generated during operation of the CMOS devices cannot dissipate via the substrate 1, concentration of the heat would deteriorate performances and reliability of the CMOS devices.

At present, how to eliminate the parasitic channel 02 while preventing heat concentration in the CMOS devices is an urgent problem in the field.

SUMMARY

In order to address at least the above issues, a semiconductor device and a method for manufacturing the semiconductor device are provided according to embodiments of the present disclosure. A parasitic channel in a CMOS device can be eliminated through a filling layer between a fin and a substrate, while heat concentration is avoided.

In a first aspect, a method for manufacturing a semiconductor device is provided according to an embodiment of the present disclosure. The method comprises: providing a substrate; forming a fin, a dummy gate, a first spacer, and a hard mask on a surface of the substrate, where the fin comprises a nanoscale stacking structure and multiple sacrificial layers, the nanoscale stacking structure comprises multiple conductive nanosheets, each of which extends in parallel with a surface of the substrate, the multiple conductive nanosheets and the multiple sacrificial layers are alternately stacked along a direction perpendicular to the substrate, the fin intersects with the dummy gate, one of the multiple sacrificial layers in the fin is in contact with the substrate, the dummy gate is located at a surface of the fin away from the substrate, the first spacer is located at two opposite sides of the dummy gate, outer side surfaces of the first spacer is flush with the outer side surfaces, respectively, of the fin, the hard mask is located at a side of the dummy gate away from the substrate, and the hard mask covers the dummy gate and the first spacer; forming a second spacer on the substrate, where the second spacer is located at two opposite sides of the fin and of the first spacer on the surface of the substrate; etching the substrate to form a groove located directly beneath the fin, where the groove runs through the second spacer in a direction perpendicular to the second spacer; forming, in the groove, a filling layer made of an insulating dielectric material, where two opposite outer side surfaces of the filling layer are flush with outer side surfaces, respectively, of the second spacer, and thermal conductivity of the insulating dielectric material is higher than thermal conductivity of the substrate; removing the second spacer through etching; removing two opposite ends of each of the multiple sacrificial layers to form cavities, each of which has a predetermined depth; filling the cavities to form inner spacers; forming a source and a drain on the substrate through selective epitaxy; forming a first dielectric layer, which covers the source, the drain, and the dummy gate, through depositing a dielectric material; planarizing the first dielectric layer to remove the hard mask and expose the dummy gate; removing the dummy gate and the multiple sacrificial layers to release a channel comprising the multiple conductive nanosheets; forming a surrounding gate, which surrounds the multiple conductive nanosheets.

In an embodiment, etching the substrate to form the groove comprises: performing selective isotropic etching on an upper surface of the substrate to form the groove, where a width of the groove is determined according to a width of the fin.

In an embodiment, forming, in the groove, the filling layer made of the insulating dielectric material comprises: growing, on a surface of a currently-formed structure, a preliminary layer made of the insulating dielectric material, where the preliminary layer fills the groove, covers the second spacer, and covers a side surface of the hard mask; and performing plasma anisotropic etching on the preliminary layer to form the filling layer.

In an embodiment, removing the second spacer through etching comprises: removing a portion of the filling layer located directly beneath the second spacer through etching, where two opposite side surfaces of a remaining portion of the filling layer are flush with the outer side surfaces, respectively, of the fin.

In an embodiment, forming the fin, the dummy gate, the first spacer, and the hard mask on the surface of the substrate comprises: forming shallow trench isolation on the surface of the substrate after forming the fin, where the shallow trench isolation is located at the two opposite sides of the fin, and the dummy gate is located above and in contact with the shallow trench isolation; and forming an oxide dielectric layer on the fin, where the oxide dielectric layer is located between the dummy gate and the fin and is in contact with the shallow trench isolation.

In an embodiment, forming the surrounding gate comprises: growing a high-κ dielectric layer at an inner wall of a gate cavity which formed through removing the dummy gate and the oxide dielectric layer; and filling a remaining portion of the gate cavity with a gate material to form the surrounding gate.

In an embodiment, after forming the surrounding gate, the method further comprises: forming a second dielectric layer, which covers the first dielectric layer and the surrounding gate, through depositing another dielectric material; etching the first dielectric layer and the second dielectric layer to form contact holes which expose the source, the surrounding gate, and the drain, respectively; and filling the contact holes with a conductive material to form contact electrodes.

In an embodiment, the insulating dielectric material comprises at least one of: aluminum nitride, boron nitride, or silicon carbide.

In a second aspect, a semiconductor device manufactured through any foregoing method is provided according to an embodiment of the present disclosure. The semiconductor device comprises: a substrate; a nanoscale stacking structure, disposed above the substrate, where the nanoscale stacking structure comprises multiple conductive nanosheets, each of which extends in parallel with a surface of the substrate; a surrounding gate, surrounding the multiple conductive nanosheets; a first spacer, located above the nanoscale stacking structure; inner spacers, where multiple layers of the inner spacers and the multiple conductive nanosheets are alternately stacked along a direction perpendicular to the substrate, the inner spacers are located at two opposite sides of the surrounding gate, and the first spacer is located at the two opposite sides of the surrounding gate; a source and a drain, which are located at two opposite sides, respectively, of the nanoscale stacking structure and are in contact with the substrate, and each of the multiple conductive nanosheets are in electrical contact with both the source and the drain; and a filling layer, disposed beneath the nanoscale stacking structure, where the filling layer is in contact with the substrate and the inner spacers.

In an embodiment, the semiconductor device further comprises a protective dielectric layer and three contact electrodes, where the protective dielectric layer covers the source, the drain, and the surrounding gate, the three contact electrodes run through the protective dielectric layer and are in electrical contact with the source, the drain, and the surrounding gate, respectively.

The semiconductor device and the method for manufacturing the semiconductor device are provided according to embodiments of the present disclosure. The filling layer is formed between the fin and the substrate, and the thermal conductivity of the insulating dielectric material forming the filling layer is higher than that of the substrate. Thereby, a parasitic channel in a CMOS device can be eliminated while avoiding heat concentration in a CMOS device.

BRIEF DESCRIPTION OF THE DRAWINGS

Hereinafter drawings to be applied in embodiments of the present disclosure or in conventional technology are briefly described, in order to clarify illustration of technical solutions according to embodiments of the present disclosure or in conventional technology. Apparently, the drawings in the following descriptions are only some embodiments of the present disclosure, and other drawings may be obtained by those skilled in the art based on the provided drawings without exerting creative efforts.

FIG. 6*a* is a stereoscopic view, FIG. 6*b* a cross-sectional view in a vertical plane passing line a-a as shown in FIG. 6*a*, and FIG. 6*c* is a cross-sectional view in a vertical plane passing line b-b as shown in FIG. 6*a*.

FIG. 7*a* is a stereoscopic view, and FIG. 7*b* a cross-sectional view in a vertical plane passing line a-a as shown in FIG. 7*a*.

FIG. 8*a* is a stereoscopic view, FIG. 8*b* a cross-sectional view in a vertical plane passing line a-a as shown in FIG. 8*a*, and FIG. 8*c* is a cross-sectional view in a vertical plane passing line b-b as shown in FIG. 8*a*.

FIG. 10*b* is a cross-sectional view in a vertical plane perpendicular to the fin-line.

Figure 1:
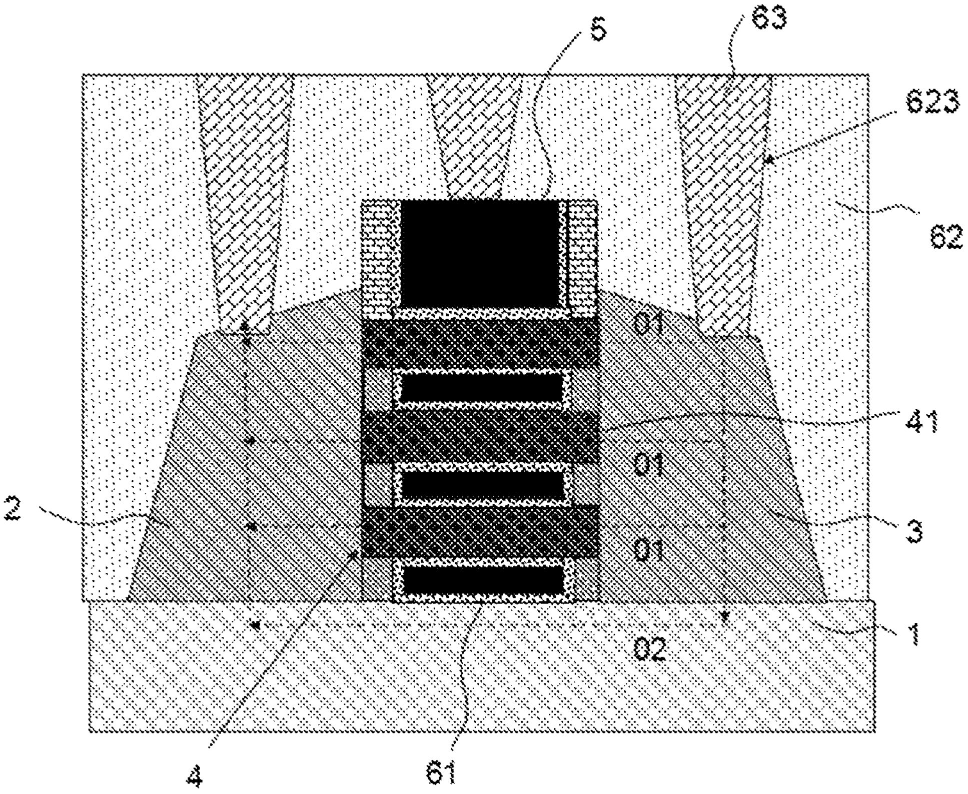
FIG. 1 is a schematic structure diagram of a cross section parallel with a fin-line of a conventional semiconductor device.
Figure 2:
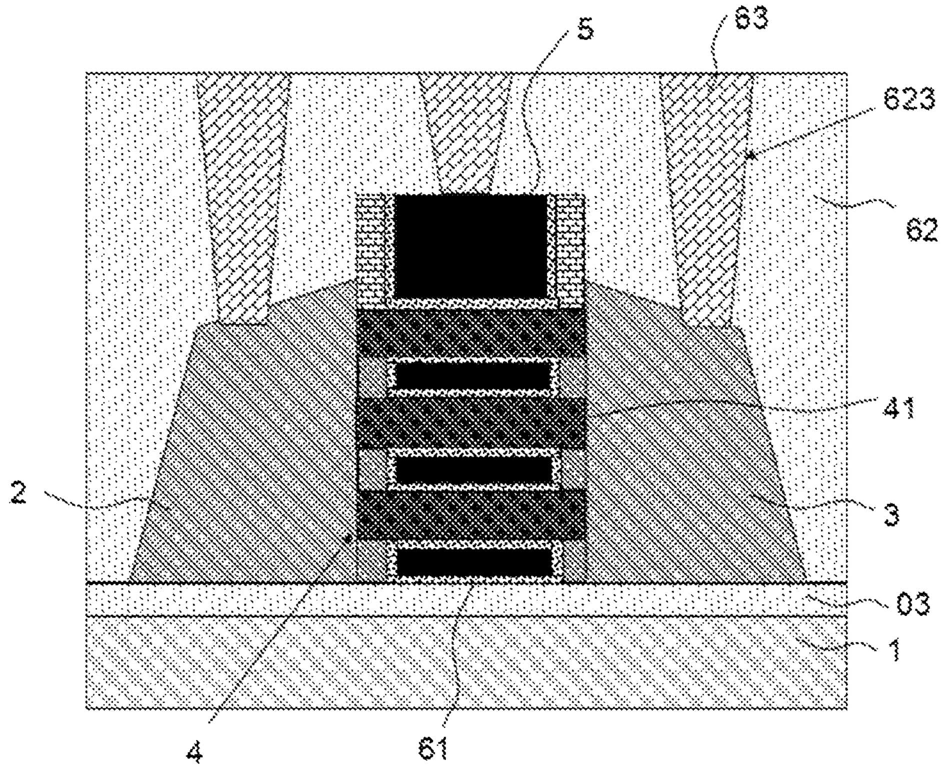
FIG. 2 is a schematic structure diagram of a cross section parallel with a fin-line of another conventional semiconductor device.

It should be noted that in the above figures, the cross section in the direction a-a is parallel to or coincident with the fin line direction, and the cross section in the direction b-b is parallel to or coincident with the vertical fin line direction.

| Reference numerals: | |
|---|---|
| 1: standard channel, | 02: parasitic channel, |
| 03: isolation layer, | 1: substrate, |
| 11: groove, | 12: shallow groove isolation, |
| 2: source, | 3: drain, |
| 4: nanoscale stacking structure, | 41: conductive nanosheet, |
| 5: surrounding gate, | 61: high-κ dielectric layer, |
| 62: protective dielectric layer, | 623: contact hole, |
| 63: contact electrode, | 641: first spacer, |
| 642: second spacer, | 643: inner spacer, |
| 65: oxidized dielectric layer, | 66: dummy gate, |
| 7: fin, | 71: sacrificial layer, |
| 8: preliminary layer, | 81: filling layer, |
| 9: hard mask. | |

DETAILED DESCRIPTION OF EMBODIMENTS

Hereinafter the present disclosure would be described more thoroughly with reference to the relevant drawings, in order to facilitate understanding of the present disclosure. Embodiments of the present disclosure are shown in the drawings, and the present disclosure may be implemented in various forms and thus is not limited to the embodiments described herein. These embodiments are intended for render the present disclosure more thorough and more comprehensive.

Unless otherwise defined, all technical and scientific terms used herein have the same meaning as the common understanding of those skilled in the art. The terms used herein are intended for describing specific embodiments rather than limiting a scope of the present disclosure.

Spatial relation terms such as "under", "below", "bottom", "beneath", "above", "top", and the like, may be utilized herein to describe a relationship between one element and another, or between one feature and another, as shown in the drawings. It should be understood that the spatial relation term may refer to another orientation of a device in practice besides an orientation as shown in the drawings. For example, when flipping a device as shown in the drawing, an element or a feature described as "beneath", "under", or "below" another element or another feature would become on top of the other element or the other feature. Thus, the exemplary terms "beneath" and "below" may refer being at a bottom and at a top in the two orientations. In addition, there may be orientations (e.g., rotated by 90 degrees or another angle). In such cases, the spatial relation terms used herein shall be interpreted correspondingly.

An element described as "fixedly connected to" another element may be directly on the other element, or there may be intermediate elements between the two. An element described to be "connected to" another element may be directly connected to the other element, or there may be intermediate elements between the two. There is no intermediate element between the two element when an element is described to be "directly on" another element. The terms "vertical", "horizontal", "left of", "right of", and similar expressions used herein are merely illustrative.

Singular forms modified by, for example, "a", "an", "the", and "said" may refer to a plurality, unless expressively indicated otherwise. The terms "include", "comprising", and "have" specifies presents of a modified feature, integrity, step, operation, component, part, or a combinations of the above, but they do not exclude a possibility of presence or addition of one or more other features, integrities, steps, operations, components, parts, or combinations of the above.

Figure 3:
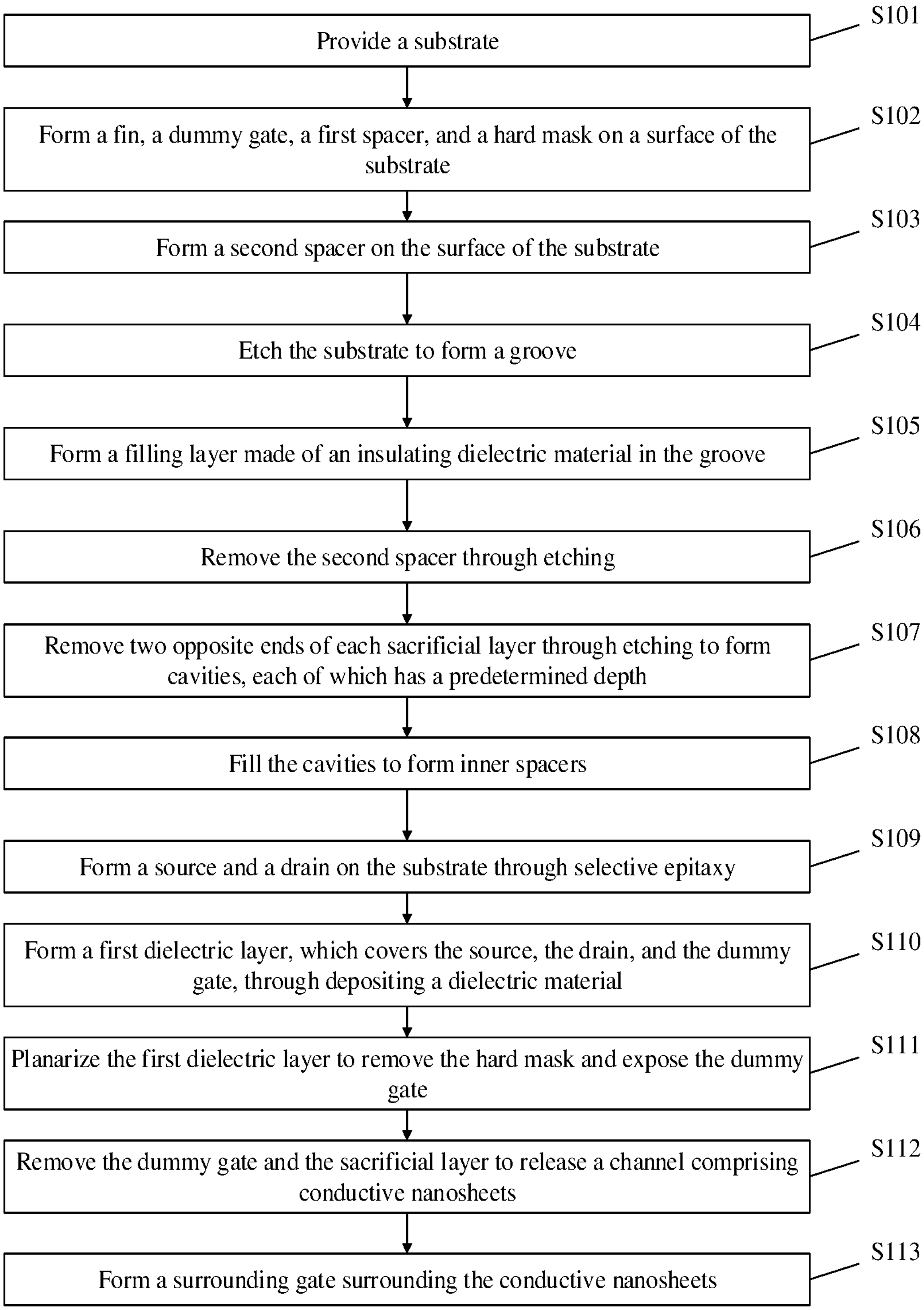
FIG. 3 is a schematic flow chart of a method for manufacturing a semiconductor device according to an embodiment of the present disclosure.

In a first aspect, a method for manufacturing a complementary metal oxide semiconductor device is provided according to an embodiment of the present disclosure. Reference is made to FIG. 3, where the method comprises steps S101 to S113.

In step S101, a substrate is provided.

A material of the substrate may be silicon.

In step S102, a fin, a dummy gate, a first spacer, and a hard mask are formed on a surface of the substrate.

Figure 4A:
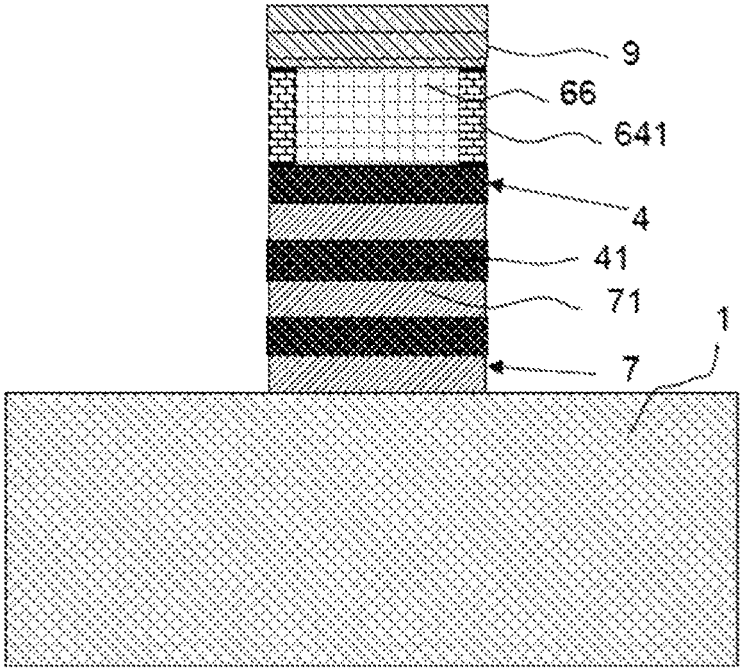
FIGS. 4*a* to 4*f* are schematic structural diagrams of cross sections parallel with a fin-line of multiple intermediate structures during manufacture of a semiconductor device according to an embodiment of the present disclosure.

Reference is made to FIG. 4*a*. The fin 7 comprises a nanoscale stacking structure 4 and multiple sacrificial layers 71. The hard mask 9 may comprises $SiO_2$ and/or SiN.

The nanoscale stacking structure 4 comprises multiple conductive nanosheets 41. Each conductive nanosheet 41 extends in parallel with a surface of the substrate 1. The conductive nanosheets 41 and the sacrificial layers 71 are alternately stacked along a direction perpendicular to the substrate 1. In the fin 7, a layer in contact with the substrate 1 is one of the sacrificial layers 71.

Figure 6A:
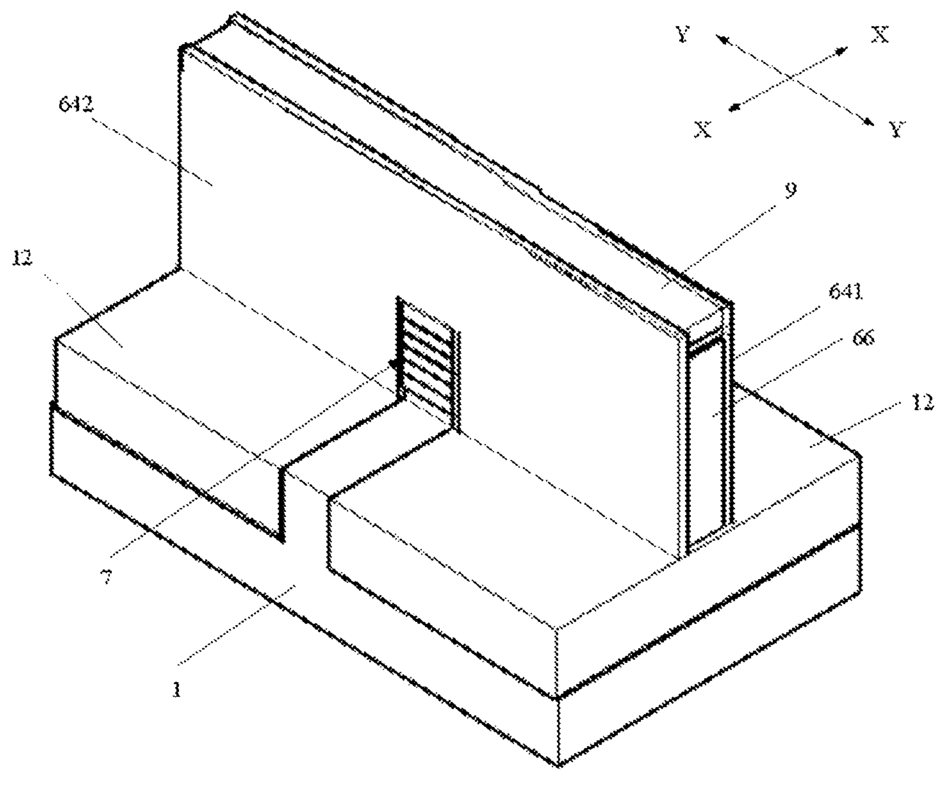
FIGS. 6*a* to 6*c* are schematic structural diagrams under different views in a process of forming a fin, a dummy gate, a first spacer, and a hard mask according to an embodiment of the present disclosure, where

A longitudinal direction of the fin 7 is defined to be a direction of a fin-line. The dummy gate 66 intersects with the fin 7 orthogonally. Reference is made to FIG. 6*a*. Herein the direction of the fin-line is called an X direction, and a direction perpendicular to the fin-line in the same horizontal plane is called a Y direction. A material of the conductive nanosheet 41 may be silicon, and a material of the sacrificial layer 71 may be silicon germanium. The hard mask 9 may comprises an upper film, a middle film, and a lower film from top to bottom. Materials of the upper film, the middle film, and the lower film may be $SiO_2$, SiN, and $SiO_2$, respectively, and are not limited to such example.

The dummy gate 66 is located at a surface of the fin 7 away from the substrate 1. The first spacer 641 is located at two opposite sides of the dummy gate 66 along the X direction. Outer side surfaces of the first spacer 641 and the outer side surfaces of the fin 7 are aligned with the same positions, respectively, along the X direction. The hard mask 9 is located directly above the dummy gate 66. Two ends of the hard mask 9 and the outer side surfaces of the first spacer 641 are aligned with the same positions, respectively, along the X direction. The hard mask 9 covers the dummy gate 66 and the first spacer 641.

In an embodiment, forming the fin 7, the dummy gate 66, the first spacer 641 and the hard mask 9 on the surface of the substrate 1 comprises a following step.

After forming the fin 7 on the surface of the substrate 1, shallow trench isolation 12 is formed on the surface of the substrate 1. The shallow trench isolation 12 is located at two opposite sides of the fin 7 along the Y direction. That is, two side surfaces of the fin 7 along the Y direction and inner surfaces of the two portions of the shallow trench isolations 12 facing each other are aligned with the same positions, respectively, along the Y direction. The dummy gate 66 is located above the shallow trench isolation 12, and a bottom of the dummy gate 66 is in contact with the shallow trench isolation 12.

Figure 6B:
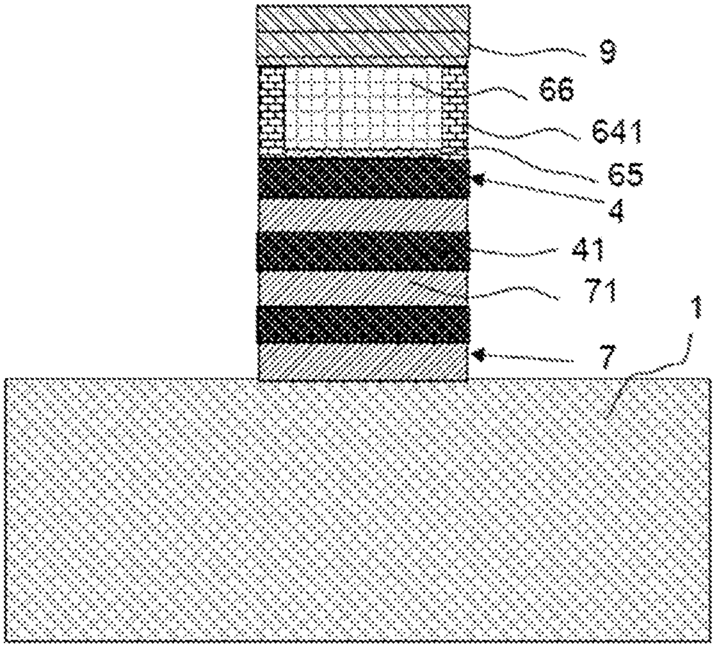
Figure 6C:
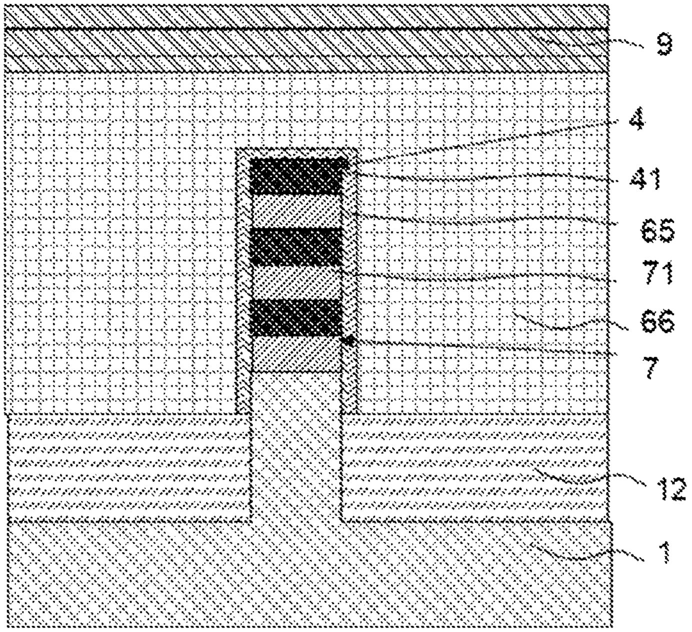

Reference is made to FIGS. 6*b* and 6*c*. After an oxide dielectric layer 65 is formed on the fin 7, the dummy gate 66 and the hard mask 9 are fabricated. The oxide dielectric layer 65 is located between the dummy gate 66 and the fin 7 and extends along the Y direction to cover the fin 7, so as to isolate the fin 7 from the dummy gate 66 throughout the Y direction. A bottom of the oxide dielectric layer 65 is in contact with the shallow trench isolation 12. A material of the oxide dielectric layer 65 may be silicon oxide.

In step S103, a second spacer 642 is formed on the surface of the substrate 1.

Figure 4B:
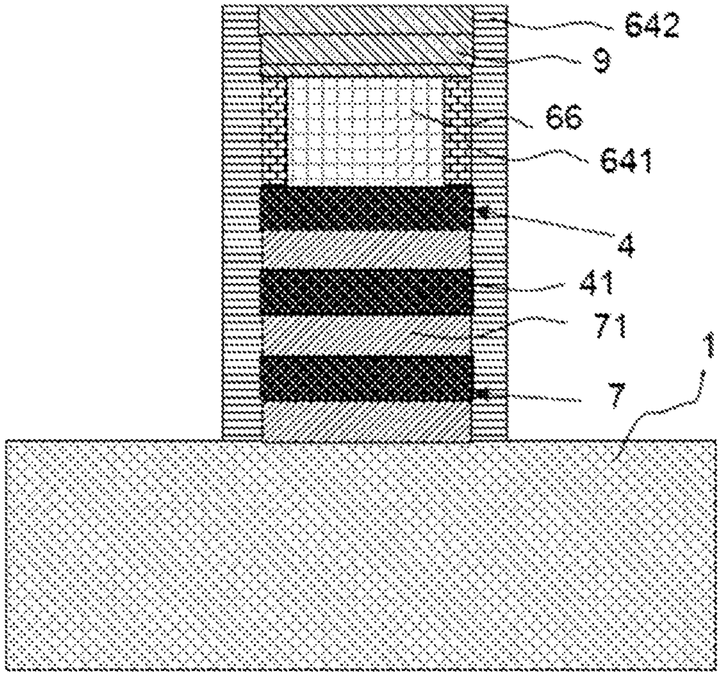

Reference is made to FIG. 4*b*. The second spacer 642 is located on the two opposite sides of the fin 7 and also two opposite sides of the first spacer 641 along the X direction. An upper surface of the second spacer 642 is flush with an upper surface of the hard mask 9.

In step S104, the substrate 1 is etched to form a groove.

Figure 4C:
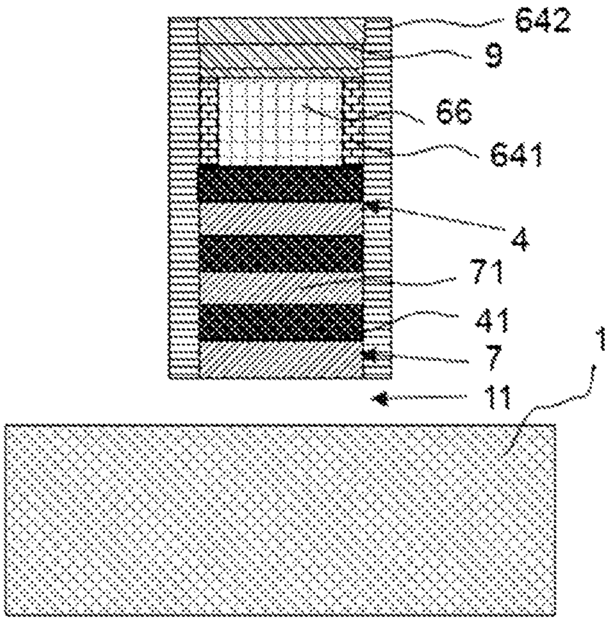

Reference is made to FIG. 4*c*. The groove 11 is located directly beneath the fin 7 and runs through the second spacer 642 perpendicularly along the X direction. The substrate 1 may be subject to selective isotropic etching, during which tetramethylammonium hydroxide (TMAH) may be utilized. Alternatively, the substrate 1 may be subject to plasma etching, during which $NF_3$, $SF_6$, and the like may be utilized. The substrate 1 is etched until the groove runs through the substrate 1 under the second spacer 642, such that the fin 7 is suspended over the substrate 1. The fin 7 would not collapse since the second spacer 642 is still connected to the shallow trench isolation 12.

In an embodiment, etching the substrate 1 to form the groove 11 comprises a following step.

A width of the groove 11 is determined according to a width of the fin 7. Selective isotropic etching is performed on the substrate 1 from an upper surface of the substrate 1, so as to form the groove 11. The width of the groove 11 may be identical to that of the fin 7.

In step S105, a filling layer made of an insulating dielectric material is formed in the groove 11.

Figure 4D:
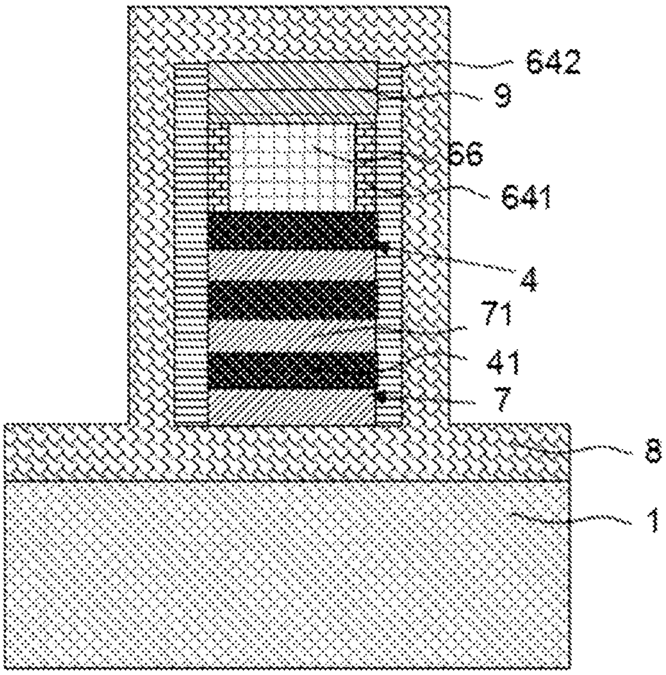
Figure 4E:
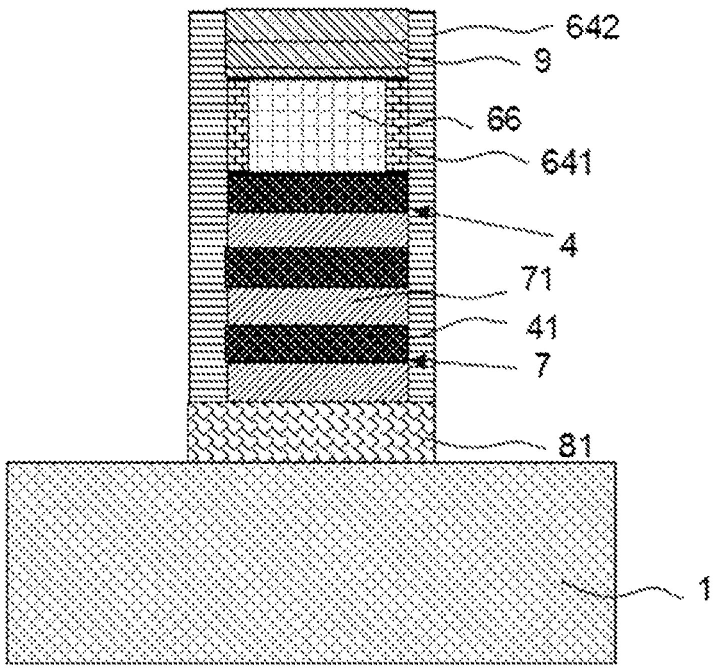
Figure 4F:
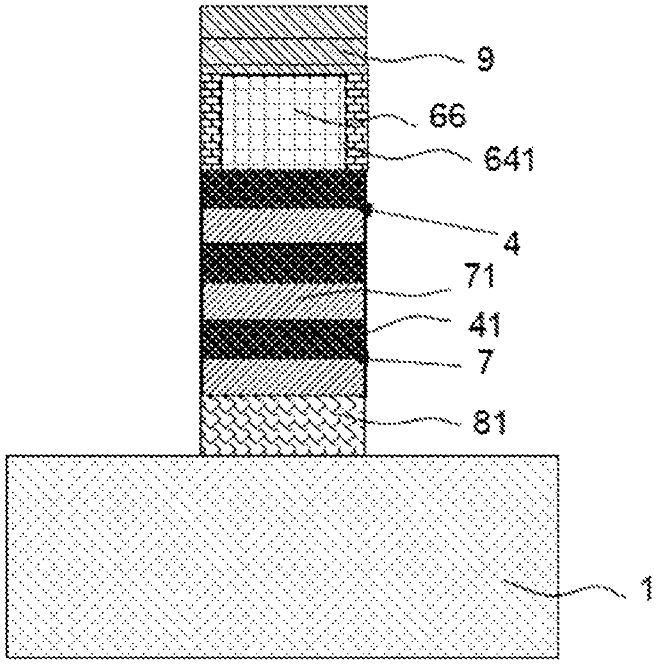

Reference is made to FIGS. 4*d* to 4*f*. Two opposite outer side surfaces of the filling layer 81 are flushed with outer side surfaces, respectively, of the second spacer 642. Thermal conductivity of the insulating dielectric material is higher than that of the substrate 1. The insulating dielectric material comprises at least one of: aluminum nitride, boron nitride, or silicon carbide. In this embodiment, the insulating dielectric material is aluminum nitride.

In an embodiment, forming the filling layer 81 made of the insulating dielectric material in the groove 11 comprises following steps. A preliminary layer 8 made of the insulating dielectric material is grown at a surface of a currently formed structure. Plasma anisotropic etching is performed on the preliminary layer 8 to form the filling layer 81.

The preliminary layer 8 may be grown through atomic layer deposition (ALD). The preliminary layer 8 fills the groove 11, covers the second spacer 642, and covers side surfaces of the hard mask 9.

In step S106, the second spacer 642 is removed through etching.

In an alternative embodiment, removing the second spacer 642 comprises a following step. The filling layer 81 located directly beneath the second spacer 642 is removed through etching, such that two opposite outer side surfaces of the remaining filling layer 81 and the outer side surfaces of the fin 7 are aligned with the same positions, respectively, along the X direction.

In step S107, two opposite ends of each sacrificial layer 71 are removed through etching to form cavities, each of which has a predetermined depth.

The predetermined length is not specifically limited herein.

In step S108, the cavities are filled to form inner spacers.

In step S109, a source and a drain are formed on the substrate 1 through selective epitaxy.

In step S110, a first dielectric layer, which covers the source, the drain, and the dummy gate 66, is formed through depositing a dielectric material.

In an embodiment, the first dielectric layer is made of silicon oxide. The present disclosure is not limited thereto.

In step S111, the first dielectric layer is planarized to remove the hard mask 9 and expose the dummy gate 66.

In step S112, the dummy gate 66 and the sacrificial layers 71 are removed to release a channel comprising the conductive nanosheets 41.

In step S113, a surrounding gate surrounding the conductive nanosheets 41 is formed.

Figure 12:
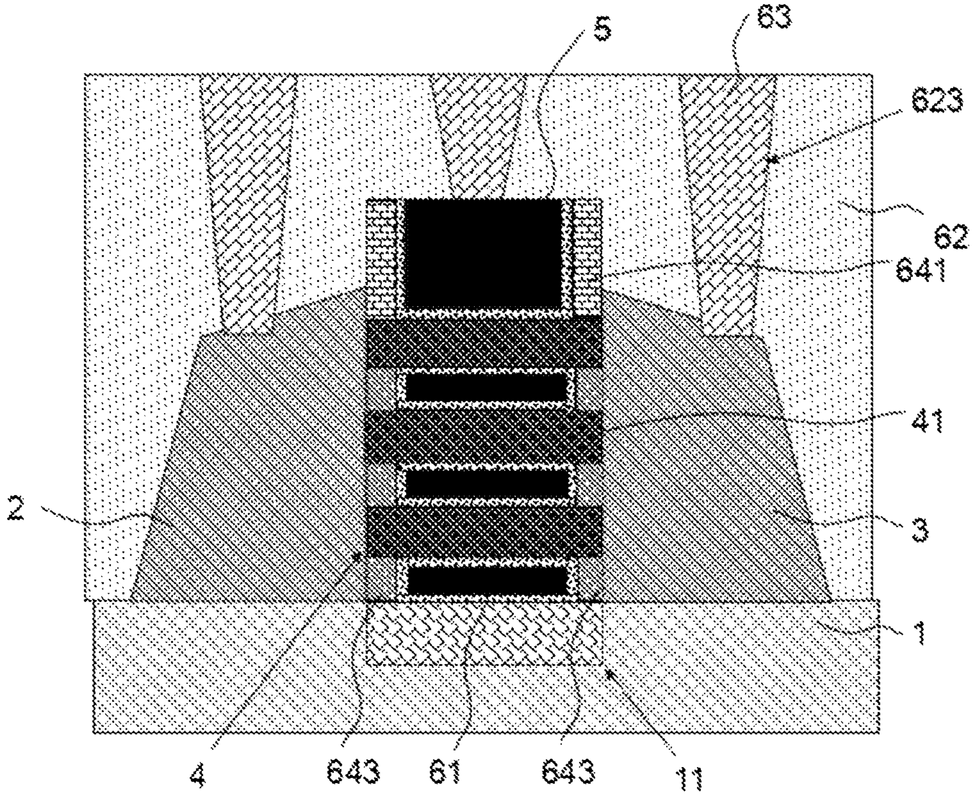
FIG. 12 is a schematic cross-sectional view in a vertical plane passing a fin-line of a semiconductor device according to an embodiment of the present disclosure.

Reference is made to FIG. 12. In an embodiment, a material of the source 2 and a material of the drain 3 are both silicon germanium, and a material of the surrounding gate 5 is aluminum or tungsten, which is not limited herein.

In an embodiment, forming the surrounding gate 5 comprises following steps. A high-κ dielectric layer 61 is grown on an inner wall of a gate cavity formed through removing the dummy gate 66 and removing the oxide dielectric layer 65. Then, a remaining portion of the gate cavity is filled with a gate material to form the surrounding gate 5.

In an embodiment, after forming the surrounding gate 5, the method further comprises following steps. A second dielectric layer, which covers the first dielectric layer and the surrounding gate 5, are formed through depositing another dielectric material. The first dielectric layer and the second dielectric layer are etched to form contact holes 623, which expose the source 2, the surrounding gate 5, and the drain 3, respectively. The contact holes 623 are filled with a conductive material to form the contact electrodes 63.

A material of the second dielectric layer may be identical to that of the first dielectric layer. The second dielectric layer and the first dielectric layer may constitute a protective dielectric layer 62 as a whole.

The method for manufacturing the semiconductor device is simple in processing. The groove 11 is formed between the fin 7 and the substrate 1 through performing isotropic etching on the substrate 1, and the groove 11 is filled with the insulating dielectric material having a thermal conductivity higher than that of the substrate 1. Thereby, a parasitic channel can be eliminated while avoiding heat concentration in a CMOS device. The fabrication of the second spacer 642 can effectively avoid collapse of the fin 7 when forming the groove 11. The steps S101, S102, S107, and S113 each may be implemented or improved through a conventional means, which is not limited herein.

Figure 5:
FIG. 5 is a schematic flow chart of a method for manufacturing a semiconductor device according to another embodiment of the present disclosure.

In the second aspect, a method for manufacturing a CMOS device is provided according to an embodiment of the present disclosure. Reference is made to FIG. 5. On a basis of the first aspect, the method may comprises steps S201 to S210.

In step S201, a substrate 1 is provided.

In step S202, a fin 7, shallow trench isolation 12, an oxide dielectric layer 65, a dummy gate 66, a first spacer 641, and a hard mask 9 are formed on a surface of the substrate 1. Reference is made to FIGS. 6*a* to 6*c*.

Figure 7A:
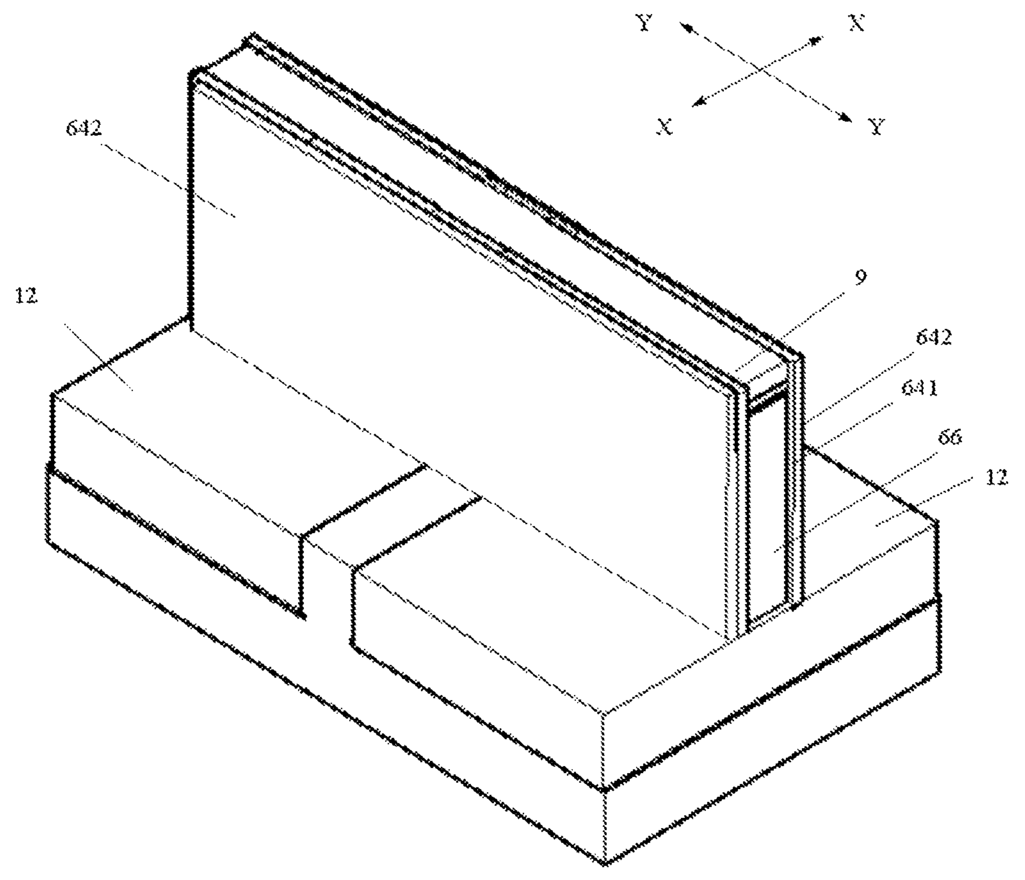
FIGS. 7*a* to 7*b* are schematic structural diagrams under different views in a process of forming a second spacer according to an embodiment of the present disclosure, where
Figure 7B:
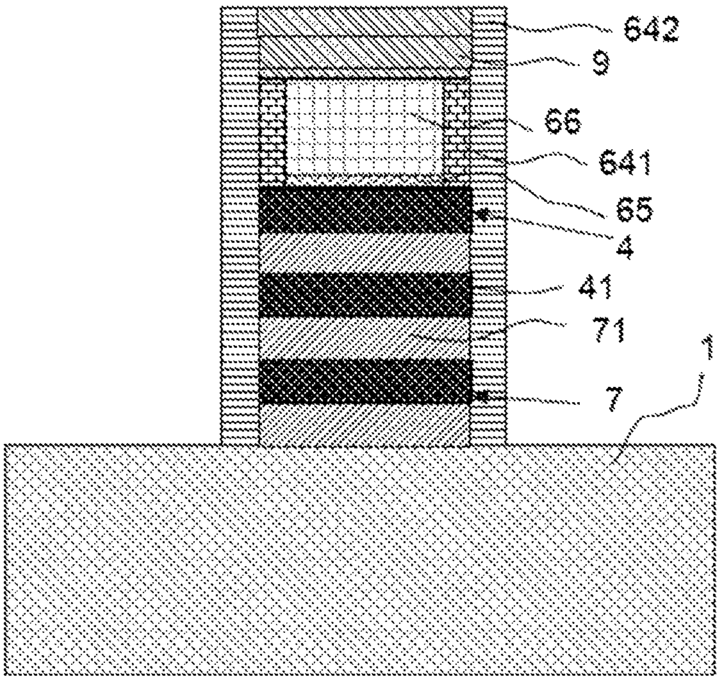

In step S203, a second spacer 642, which is located at opposite sides of the fin 7 and opposite sides of the first spacer 641 along the X direction, is formed on the surface of the substrate 1. Reference is made to FIGS. 7*a* and 7*b*.

Figure 8A:
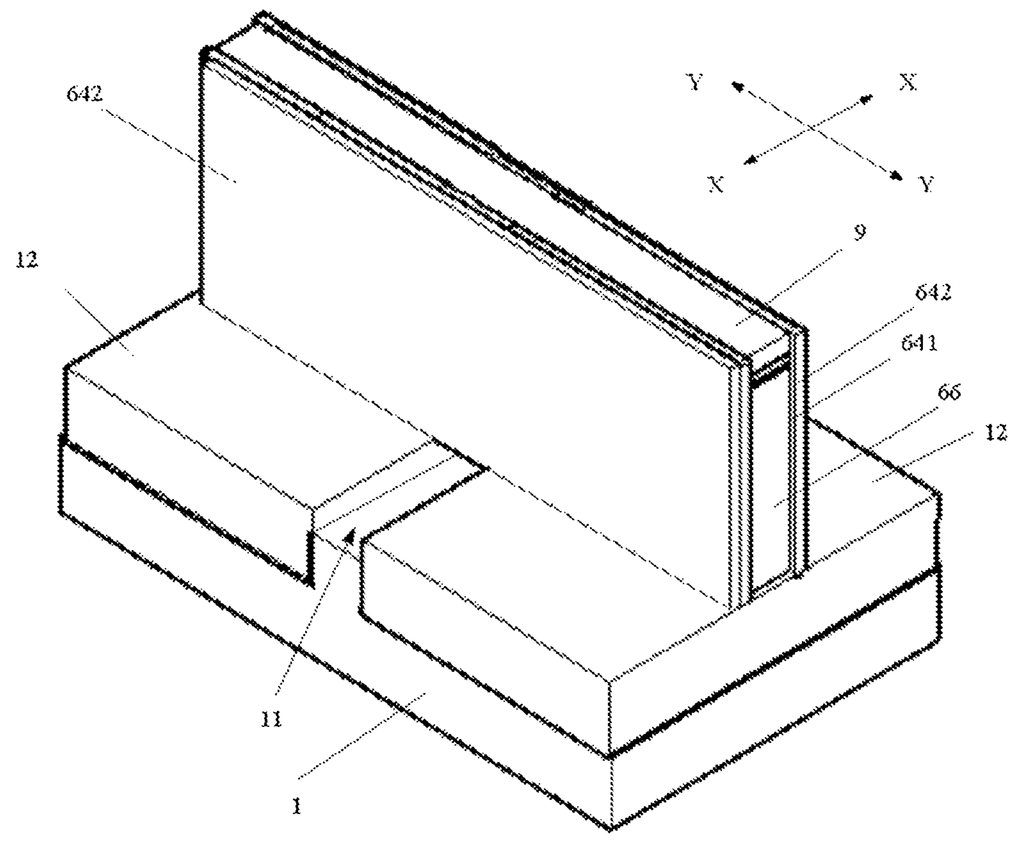
FIGS. 8*a* to 8*c* are schematic structural diagrams under different views in a process of forming a groove according to an embodiment of the present disclosure, where
Figure 8B:
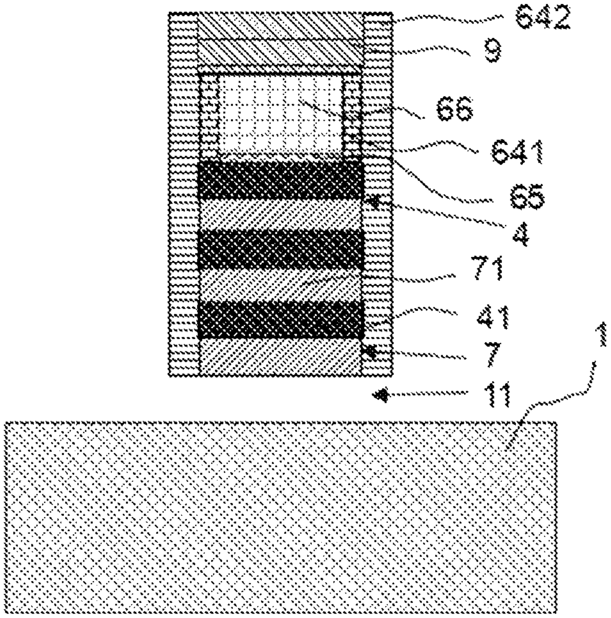
Figure 8C:
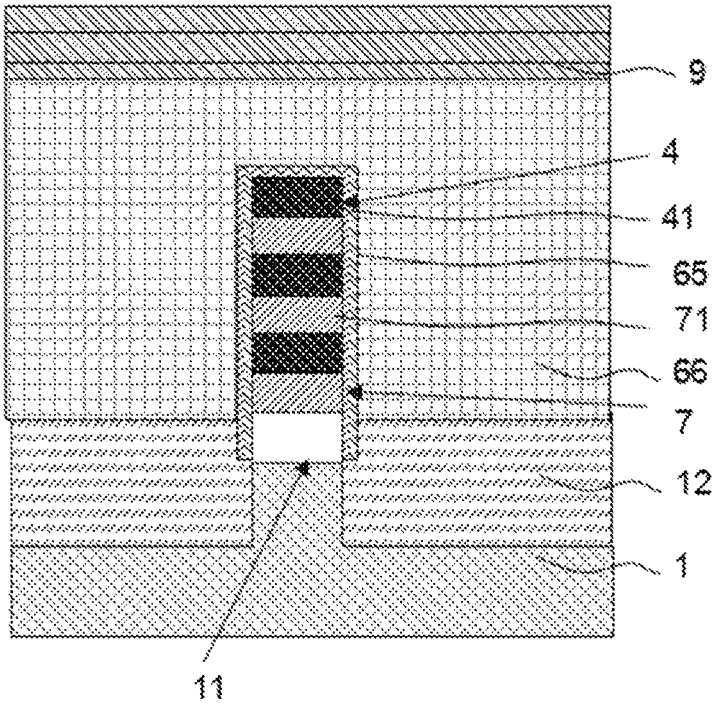

In step S204, the substrate 1 is etched at its upper surface to form a groove 11 along the X direction. Reference is made to FIGS. 8*a* to 8*c*.

The step S204 is equivalent to etching a portion of the substrate 1, which is located between two portions of shallow trench isolations 12 and adjacent to the fin 7, to form the groove 11.

Figure 9:
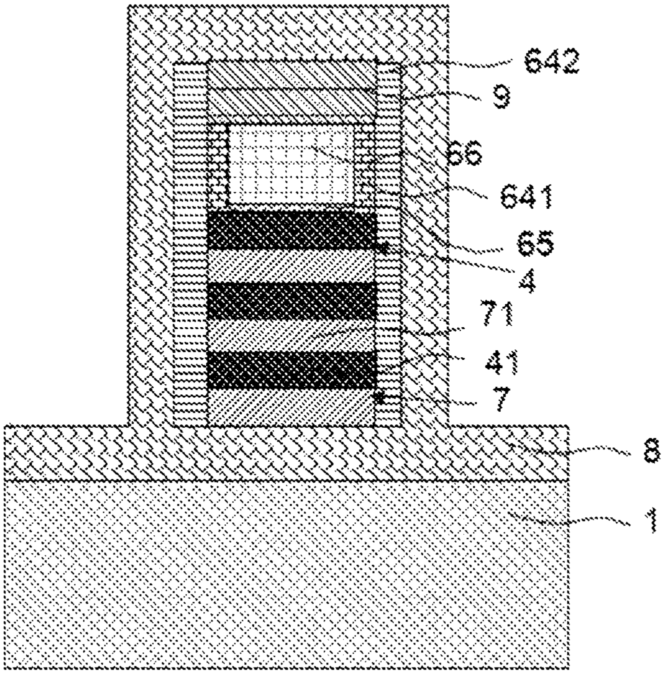
FIG. 9 is a schematic cross-sectional view in a vertical plane passing a fin-line in a process of forming a preliminary layer according to an embodiment of the present disclosure.

In step S205, a preliminary layer 8 made of an insulating dielectric material is grown on a surface of the currently formed structure. Reference is made to FIG. 9.

Figure 10A:
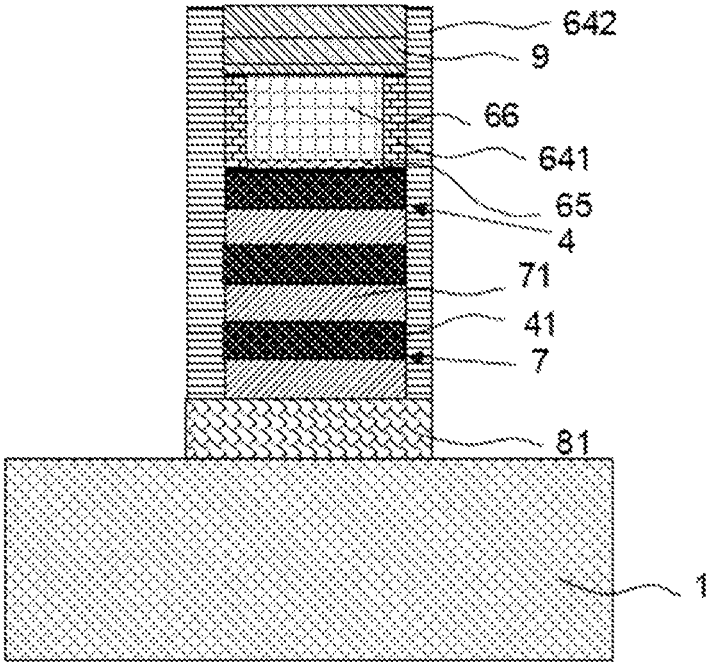
FIG. 10*a* and FIG. 10*b* are schematic structural diagrams under different views in a process of forming a filling layer according to an embodiment of the present disclosure, where FIG. 10*a* a cross-sectional view in a vertical plane passing a fin-line.
Figure 10B:
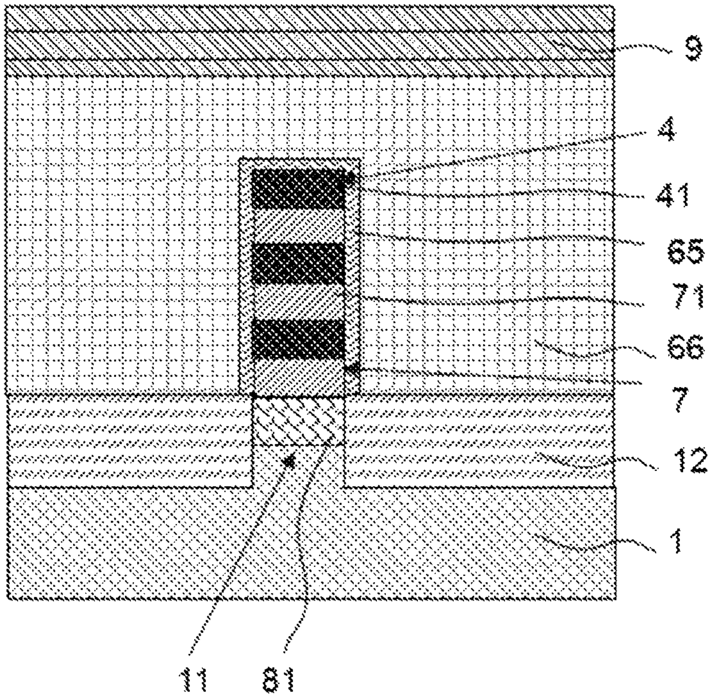

In step S206, the preliminary layer 8 is etched through plasma anisotropy etching, so as to form a filling layer 81. Reference is made to FIG. 10.

Figure 11:
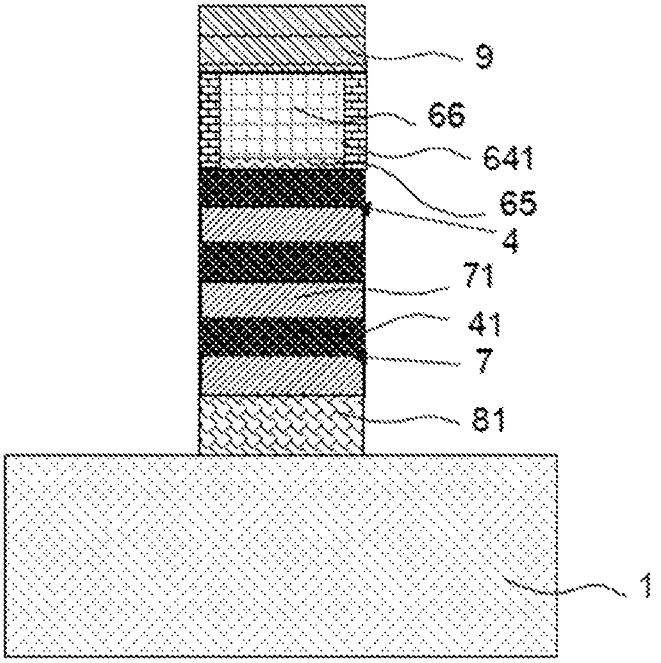
FIG. 11 is a schematic cross-sectional view in a vertical plane passing a fin-line in a process of forming a preliminary layer according to another embodiment of the present disclosure.

In step S207, the filling layer 81 located directly beneath the second spacer 642 is removed through etching, so that the two opposite outer side surfaces of the remaining filling layer 81 and the outer side surfaces of the fin 7 are aligned to the same positions, respectively, along the X direction. Reference is made to FIG. 11.

In step S208, the inner spacers 643, the source 2, the drain 3, and the first dielectric layer are formed on the surface of the substrate 1. After removing the dummy gate 66 and the oxide dielectric layer 65, a high-κ dielectric layer 61 and the surrounding gate 5 are formed. Reference is made to FIG. 12.

In step S209, a dielectric material is deposited to form a second dielectric layer, and the first dielectric layer and the second dielectric layer are etched to form contact holes 623 which expose the source 2, the surrounding gate 5, and the drain 3, respectively.

In step S210, the contact holes 623 are filled with a conductive material to form contact electrodes 63.

In a third aspect, a semiconductor device manufactured through any foregoing method is provided according to an embodiment of the present disclosure. Reference is made to FIG. 12. The semiconductor device comprises: a substrate 1, a nanoscale stacking structure 4, surrounding gate 5, a first spacer 641, inner spacers 643, a source 2, a drain 3, and a filling layer 81.

The nanoscale stacking structure 4 is disposed above the substrate 1. The nanoscale stacking structure 4 comprises multiple conductive nanosheets 41, each of which extends in parallel with a surface of the substrate 1.

The surrounding gate 5 surrounds the conductive nanosheets 41.

The first spacer 641 is located above the nanoscale stacking structure 4.

Multiple layers of the inner spacers 643 and the multiple conductive nanosheets 41 are alternately stacked along the direction perpendicular to the substrate 1. The inners spacer 643 are disposed at two opposite sides of the surrounding gate 5, and the first spacer 641 is also dispose at the two opposite sides of the surrounding gate 5.

The source 2 and the drain 3 are located at two opposite sides of the nanoscale stacking structure 4 and are in contact with the substrate 1. Each conductive nanosheet 41 is in electrical contact with both the source 2 and the drain 3.

The filling layer 81 is located beneath the nanoscale stacking structure 4 and is in contact with the substrate 1. The bottom layer of the inner spacers 643 is in contact with the filling layer 81.

In an embodiment, the semiconductor device further comprises a protective dielectric layer 62 and three contact electrodes 63.

The protective dielectric layer 62 covers the source 2, the drain 3, and the surrounding gate 5. The contact electrodes 63 each runs through the protective dielectric layer 62. The three contact electrodes 63 are in electrical contact with the source 2, the drain 3, and the surrounding gate 5, respectively. Herein the protective dielectric layer 62 may comprises the aforementioned first dielectric layer and the aforementioned second dielectric layer, and a material of the protective dielectric layer 62 may be silicon dioxide.

In the semiconductor device, the filling layer 81 is formed between the fin 7 and the substrate 1, and the thermal conductivity of the insulating dielectric material for fabricating the filling layer 81 is higher than that of the substrate 1. Thereby, a parasitic channel can be eliminated while avoiding heat concentration in a CMOS device.

Herein the terms "some embodiments", "other embodiments" and "ideal embodiments", or the like, are intended to represent specific features, structures, materials, or characteristics described in connection with the corresponding embodiments or examples are incorporated into at least one embodiment or example of the present disclosure. The terms are schematically utilized herein and the same term does not necessarily refer to the same embodiment or example.

The technical features of the above embodiments may be arbitrarily combined. Not all possible combinations of the technical features in the foregoing embodiments are illustrated for the sake of conciseness. The combinations shall fall within the scope of the present disclosure as long as there is no conflict.

Only several implementations of the present disclosure are presented in the foregoing embodiments. The embodiments are described in detail and shall not be construed as limitations to a scope of the present disclosure. Those skilled in the art may make several modifications and improvements without departing from a concept of the present disclosure, and these modifications and improvements shall fall within the protection scope of the present disclosure. Therefore, the protection scope of the present disclosure is subject to the appended claims.

The invention claimed is:

1. A method for manufacturing a semiconductor device, comprising:

providing a substrate;

forming a fin, a dummy gate, a first spacer, and a hard mask on a surface of the substrate, wherein:

the fin comprises a nanoscale stacking structure and a plurality of sacrificial layers;

the nanoscale stacking structure comprises a plurality of conductive nanosheets, and each conductive nanosheet of the plurality of conductive nanosheets extends in parallel with a surface of the substrate;

the plurality of conductive nanosheets and the plurality of sacrificial layers are alternately stacked along a direction perpendicular to the substrate;

the fin intersects with the dummy gate;

a sacrificial layer of the plurality of sacrificial layers in the fin is in contact with the substrate;

the dummy gate is located at a surface of the fin away from the substrate;

the first spacer covers two opposite side surfaces of the dummy gate, and outer side surfaces of the first spacer is flush with the outer side surfaces, respectively, of the fin; and the hard mask is located at a side of the dummy gate away from the substrate, and the hard mask covers the dummy gate and the first spacer;

forming a second spacer on the substrate, wherein the second spacer covers two opposite side surfaces of the fin and of the first spacer;

etching the substrate to form a groove located directly beneath the fin, wherein the groove runs through the second spacer and the fin in a direction perpendicular to the second spacer;

forming, in the groove, a filling layer made of an insulating dielectric material, wherein two opposite outer side surfaces of the filling layer are flush with outer side surfaces, respectively, of the second spacer, and thermal conductivity of the insulating dielectric material is higher than thermal conductivity of the substrate;

removing, after forming the filling layer, the second spacer through etching;

removing two opposite ends of each of the plurality of sacrificial layers to form cavities, each of which has a predetermined depth;

filling the cavities to form inner spacers;

forming, after filling the cavities, a source and a drain on the substrate through selective epitaxy;

forming a first dielectric layer, which covers the source, the drain, and the dummy gate, through depositing a dielectric material;

planarizing the first dielectric layer and the hard mask to expose the dummy gate;

removing the exposed dummy gate and the plurality of sacrificial layers to release a channel comprising the plurality of conductive nanosheets;

forming a surrounding gate, which surrounds the plurality of conductive nanosheets.

2. The method according to claim 1, wherein etching the substrate to form the groove comprises:

performing selective isotropic etching on an upper surface of the substrate to form the groove, wherein a width of the groove is determined according to a width of the fin.

3. The method according to claim 1, wherein forming, in the groove, the filling layer made of the insulating dielectric material comprises:

growing, on a surface of a currently-formed structure, a preliminary layer made of the insulating dielectric material, wherein the preliminary layer fills the groove, covers the second spacer, and covers a side surface of the hard mask; and performing plasma anisotropic etching on the preliminary layer to form the filling layer.

4. The method according to claim 1, wherein removing the second spacer through etching comprises:

removing a portion of the filling layer located directly beneath the second spacer through etching, wherein two opposite side surfaces of a remaining portion of the filling layer are flush with the outer side surfaces, respectively, of the fin.

5. The method according to claim 1, wherein forming the fin, the dummy gate, the first spacer, and the hard mask on the surface of the substrate comprises:

forming shallow trench isolation on the surface of the substrate after forming the fin, wherein the shallow trench isolation is located at the two opposite sides of the fin, and a portion of the dummy gate is located above and in contact with the shallow trench isolation; and forming an oxide dielectric layer on the fin, wherein a portion of the oxide dielectric layer is located between the dummy gate and the fin and another portion of the oxide dielectric layer is in contact with the shallow trench isolation.

6. The method according to claim 5, wherein forming the surrounding gate comprises:

growing a high-K dielectric layer at an inner wall of a gate cavity which formed through removing the dummy gate and the oxide dielectric layer; and filling the gate cavity, which remains after growing the high-K dielectric layer, with a gate material to form the surrounding gate.

7. The method according to claim 1, wherein after forming the surrounding gate, the method further comprises:

forming a second dielectric layer, which covers the first dielectric layer and the surrounding gate, through depositing another dielectric material;

etching the first dielectric layer and the second dielectric layer to form contact holes which expose the source, the surrounding gate, and the drain, respectively; and filling the contact holes with a conductive material to form contact electrodes.

8. The method according to claim 1, wherein the insulating dielectric material comprises at least one of: aluminum nitride, boron nitride, or silicon carbide.

9. A semiconductor device, manufactured though the method according to claim 1, wherein the semiconductor comprises:

a substrate;

a nanoscale stacking structure, disposed above the substrate, wherein the nanoscale stacking structure comprises a plurality of conductive nanosheets, each conductive nanosheet of the plurality of conductive nanosheets extends in parallel with a surface of the substrate;

a surrounding gate, surrounding the plurality of conductive nanosheets;

a first spacer, located above the nanoscale stacking structure;

inner spacers, wherein layers of the inner spacers and the plurality of conductive nanosheets are alternately stacked along a direction perpendicular to the substrate, the inner spacers are located at two opposite sides of the surrounding gate, and the first spacer is located at the two opposite sides of the surrounding gate;

a source and a drain, which are located at two opposite sides, respectively, of the nanoscale stacking structure and are in contact with the substrate, and each conductive nanosheet of the plurality of conductive nanosheets are in electrical contact with both the source and the drain; and a filling layer, disposed beneath the nanoscale stacking structure, wherein the filling layer is in contact with the substrate and a bottommost layer of the inner spacers.

10. The semiconductor device according to claim 9, further comprising a protective dielectric layer and three contact electrodes, wherein:

the protective dielectric layer covers the source, the drain, and the surrounding gate; and the three contact electrodes run through the protective dielectric layer and are in electrical contact with the source, the drain, and the surrounding gate, respectively.

* * * * *